US 6,614,825 B1

(12) United States Patent
Hang et al.

(10) Patent No.: US 6,614,825 B1
(45) Date of Patent: *Sep. 2, 2003

(54) MONOLITHIC VCSEL-BASED OPTICAL PICKUP AND SERVO CONTROL DEVICE

(76) Inventors: Zhijiang Hang, 4 Liberty Ave., Lexington, MA (US) 02173; Victor Lazarev, 6 Baron Park La., Apt. 14, Burlington, MA (US) 01803

( * ) Notice: Subject to any disclaimer, the term of this patent is extended or adjusted under 35 U.S.C. 154(b) by 232 days.

This patent is subject to a terminal disclaimer.

(21) Appl. No.: 09/680,241

(22) Filed: Oct. 5, 2000

Related U.S. Application Data

(60) Provisional application No. 60/157,723, filed on Oct. 5, 1999.

(51) Int. Cl.[7] .................................................. H01S 5/00
(52) U.S. Cl. .................. 372/50; 369/44.12; 369/44.14; 369/44.37; 369/112.01; 369/112.14; 369/112.29; 369/121
(58) Field of Search ...................... 372/50; 369/44.11, 369/44.12, 44.14, 44.17–44.24, 44.37, 44.41, 112.01, 112.04, 112.14, 112.21, 112.29, 116, 121

(56) References Cited

U.S. PATENT DOCUMENTS

| | | | |
|---|---|---|---|
| 5,568,463 A | 10/1996 | Sahara et al. | |
| 5,757,741 A | 5/1998 | Jiang et al. | |
| 5,883,913 A | 3/1999 | Doi et al. | |
| 6,208,609 B1 * | 3/2001 | Hang et al. | 369/112 |

OTHER PUBLICATIONS

H. Narui et al., "A Monolithic Confocal Optical Pick–up Device," Optical Data Storage, Tech. Dig., p. 50, (Oct. 5, 1998).

T. Mizuno et al., "A Monolithic Confocal Laser Coupler for an Optical Pick–up," Jpn. J. Appl. Phys., Publication Board, Jpn. J. Appl. Phys. (Japan), vol. 38 (No. 4A), p. 2001–2006, (Oct. 5, 1999).

* cited by examiner

Primary Examiner—Paul Ip
Assistant Examiner—James Menefee
(74) Attorney, Agent, or Firm—O'Connell Law Firm

(57) ABSTRACT

A VCSEL-based monolithic optical pickup system for use with optical recording media with a retaining member, a plurality of VCSELs disposed on the retaining member for emitting laser beams, a plurality of detectors disposed on the retaining member for receiving reflected laser beams, and a stepped micro-mirror for reflecting laser beams emitted by the plurality of VCSELs toward optical recording media and for reflecting laser beams reflected from the recording media toward the plurality of detectors. The VCSELs and detectors can be disposed in laser/detector pairs wherein each detector surrounds its respective VCSEL. The system can incorporate upstanding VCSELs each with a sloped and mirrored side surface and with a detector disposed adjacent to the side surface whereby a laser beam emitted by the VCSEL can be directed to an optical recording media, then reflected from the optical recording media onto the side surface of the VCSEL, and then reflected by the side surface of the VCSEL onto the detector adjacent to the side surface of the VCSEL.

42 Claims, 14 Drawing Sheets

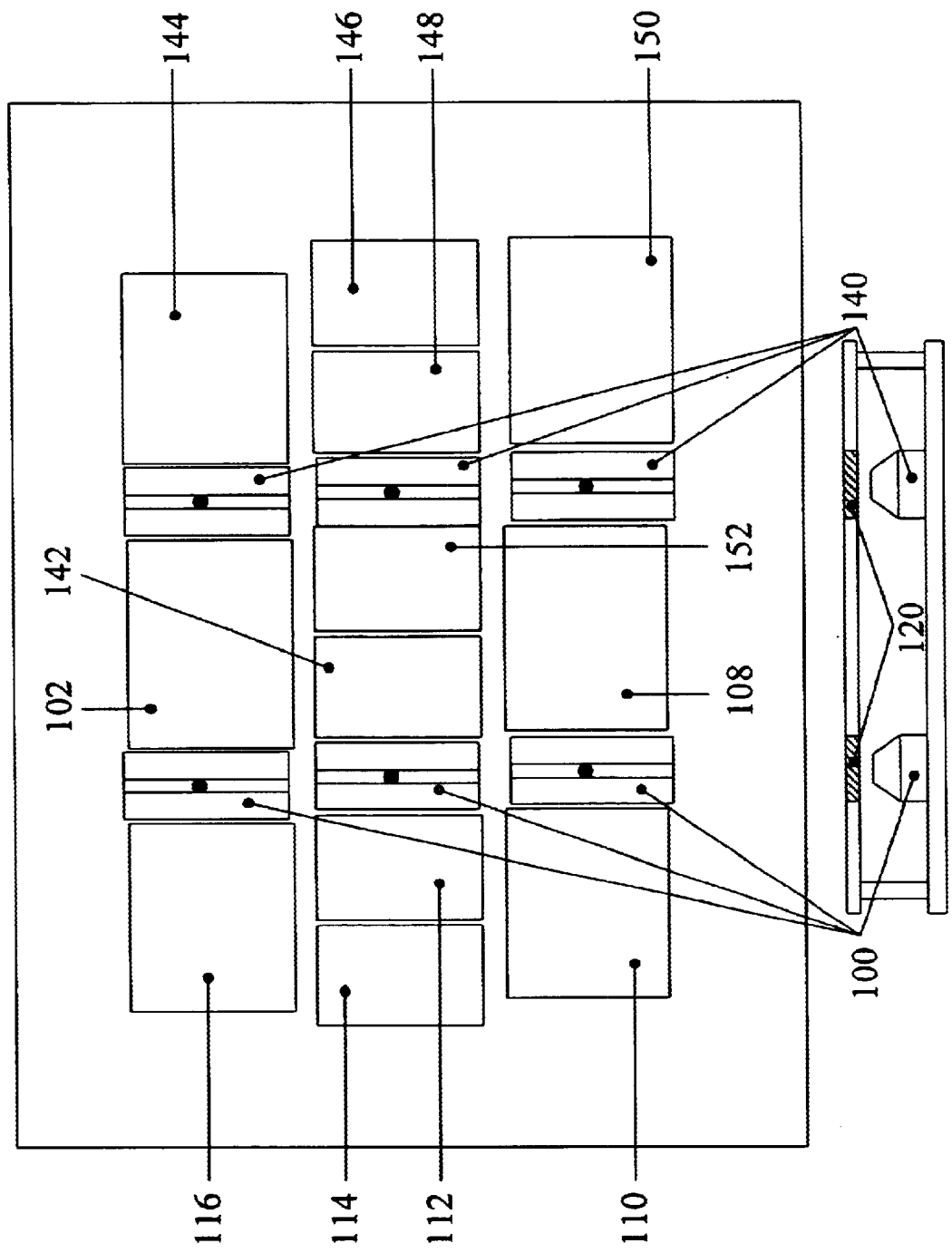

MONOLITHIC VCSEL-BASED OPTICAL PICKUP AND SERVO CONTROL DEVICE

This application claims the benefit of U.S. Provisional Application No. 60/157,723, filed Oct. 5, 1999.

FIELD OF THE INVENTION

This invention relates to optical pick-up heads using vertical surface cavity emitting lasers. More particularly, the invention relates to monolithically integrated laser/detector chips for use in the high-density optical data storage applications.

BACKGROUND OF THE INVENTION

Optical media providing digital data storage include Compact Disks (CDs), Digital Versatile Disks (DVDs), Mini Discs (Mds). High-density storage in these applications becomes important for music, video, and computer software. Optical pickup heads are used for reading information stored on a surface of such media.

Conventional optical pick-up heads consist of several components: a laser diode, a beam splitter, diffraction grating, collimating lens, objective lens, photodiode array and, possibly, additional holographic optical elements. By requiring a multitude of separate components, the optical pick-up head becomes thick, large and expensive. For the same reasons, optical alignment of the system during its assembly becomes problematic.

One will appreciate that there are two possible opportunities to obtain a small, reliable and low-cost optical pick-up that is easily capable of being mass-produced. First, the sizes of the light-emitting and light-detecting units should be reduced and, preferably, these elements should be integrated into a single semiconductor chip. Second, the optical design should be simplified to reduce the number of required elements.

One advantageous solution for decreasing the laser size is to replace an edge-emitting laser currently used in an optical disk pickup with a Vertical Cavity Surface Emitting Laser (VCSEL). The lower size limit for the fabrication of edge-emitting lasers is 50 microns in width and 100–200 microns in length. In comparison, VCSELs can be made to minute circular units of less than 10 microns in diameter. Current VCSELs emit at wavelengths between 650 nm and 980 nm. They are made of GaAs/GaAlAs, InGaAs, GaInP and AlGaAs, InP, having a sandwiched structure of multi-layer reflective surfaces between which multiple quantum-wells are formed. The broad range of available VCSEL wavelengths makes it a good candidate for use in both DVD and CD optical pickups.

Since the date of the VCSEL invention, some designs of optical pickups employing a VCSEL as a light source have been proposed. For example, U.S. Pat. No. 5,757,741 to Jiang et al., which is incorporated herein by reference, describes a CD ROM head using VCSELs. In this design as well as in other known prior art devices containing VCSELs, the conventional optical schematic is used. Because of the presence of beam splitters or holographic elements, the light-detecting parts should be distanced from VCSEL. Therefore, the replacement of edge-emitting lasers with VCSELs in these prior art devices has not brought a significant reduction of the size of the optical head and did not simplify its optical design.

It is also known that a group of inventors from the Sony Corporation is developing a promising technique that allows the use of a very simple optical design. Variants of their method have been disclosed by Sahara et al. in U.S. Pat. No. 5,568,463, by Doi et al. in U.S. Pat. No. 5,883,913, and by Mizuno et al. in the Japan Journal of Applied Physics, 1999, vol. 38, p.2001, all of which being incorporated herein by reference. The main idea of these designs is based on the phenomenon that the diameter of the light beam returning back after reflection from the disk surface is much larger than that of the initial beam emitted by the laser. As a result, a detector can be placed in close vicinity to a laser. In fact, the two can be disposed on the same optical axis. With this, such an optical schematic can contain only focusing elements and can avoid beam splitters or holographic elements. Laser and detectors are monolithically integrated into a single element.

Unfortunately, there are at least three disadvantages relating to these designs proposed by Sony. All are connected with the use of an edge-emitting laser as a light source. First, because of the comparably large size of such lasers, the dimensions of a final chip containing the lasers becomes resultantly large. Second, such optical designs are limited to detecting less than half of returned light. Third, the geometry of monolithic integrated chips is complicated and requires a large number of operations during its production.

SUMMARY OF THE INVENTION

Advantageously, the present invention sets forth with the basic object of providing improved designs for optical pickup heads.

A more particular object of the invention is to provide a monolithic method for making optical pickup heads that are thin.

Another object of the invention is to provide a monolithic method for making integrated VCSEL/detector chips for optical pickup heads that has data reading, tracking, focusing, and power monitoring capabilities.

A still further object of the invention is the provision of an optical pickup and servo control device that accomplishes the foregoing objects while materially reducing the cost thereof relative to prior art optical pickup heads.

A first preferred embodiment in accordance with the present invention comprises an integrated laser/detector chip, a stepped micro-mirror and an optical means for focusing laser light on a disk. The integrated chip contains a group of VCSELs that each act as means for generating an optical beam and that have a small aperture in the range of a few microns, photodiodes placed on the top of each VCSEL surrounding its aperture, and photodiodes for monitoring the power of each VCSEL from its bottom. This chip provides the system with data signals as well as with servo signals. The stepped micro-mirror provides the detection of focusing error signal (FES) employing a spot-size method. The tracking error signal (TES) is detected either with a push-pull method or with a 3-beam (outrigger) method. The monitoring of VCSEL power allows it to maintain a desirable level using power feedback control.

In a second embodiment of the invention, three additional VCSELs emitting at a wavelength of approximately 650 nm are added to the chip to provide data reading either from a CD or a DVD.

In a third embodiment of the invention, the integrated chip contains a wedge-like pyramid coated by a metal that serves as micro-mirrors.

In a fourth embodiment of the invention, an edge-emitting laser is inserted into the design of, for example, the third embodiment to provide for a recording of data on a disk surface.

In fifth and sixth embodiments, additional red VCSELs are used in the design of the third embodiment to provide data reading from a CD or a DVD. These two embodiments use different methods for DVD tracking.

With a plurality of embodiments of the present invention for a Monolithic VCSEL-based Optical Pickup and Servo Control Device described, one will appreciate that the foregoing discussion broadly outlines the more important features of the invention merely to enable a better understanding of the detailed description that follows and to instill a better appreciation of the inventors' contribution to the art. Before an embodiment of the invention is explained in detail, it must be made clear that the following details of construction, descriptions of geometry, and illustrations of inventive concepts are mere examples of the many possible manifestations of the invention.

BRIEF DESCRIPTION OF THE DRAWINGS

In the accompanying drawings:

FIG. 7A is a schematic view of a chip design for a pickup system according to the present invention that is capable of reading optical data from either a CD or a DVD.

DETAILED DESCRIPTION OF PREFERRED EMBODIMENTS

As is the case with many inventions, the present invention for a Monolithic VCSEL-based Optical Pickup and Servo Control Device is subject to a wide variety of embodiments. However, to ensure that one skilled in the art will fully understand and, in appropriate cases, practice the present invention, certain preferred embodiments of the broader invention revealed herein are described below and shown in the accompanying drawing figures.

Figure 1:
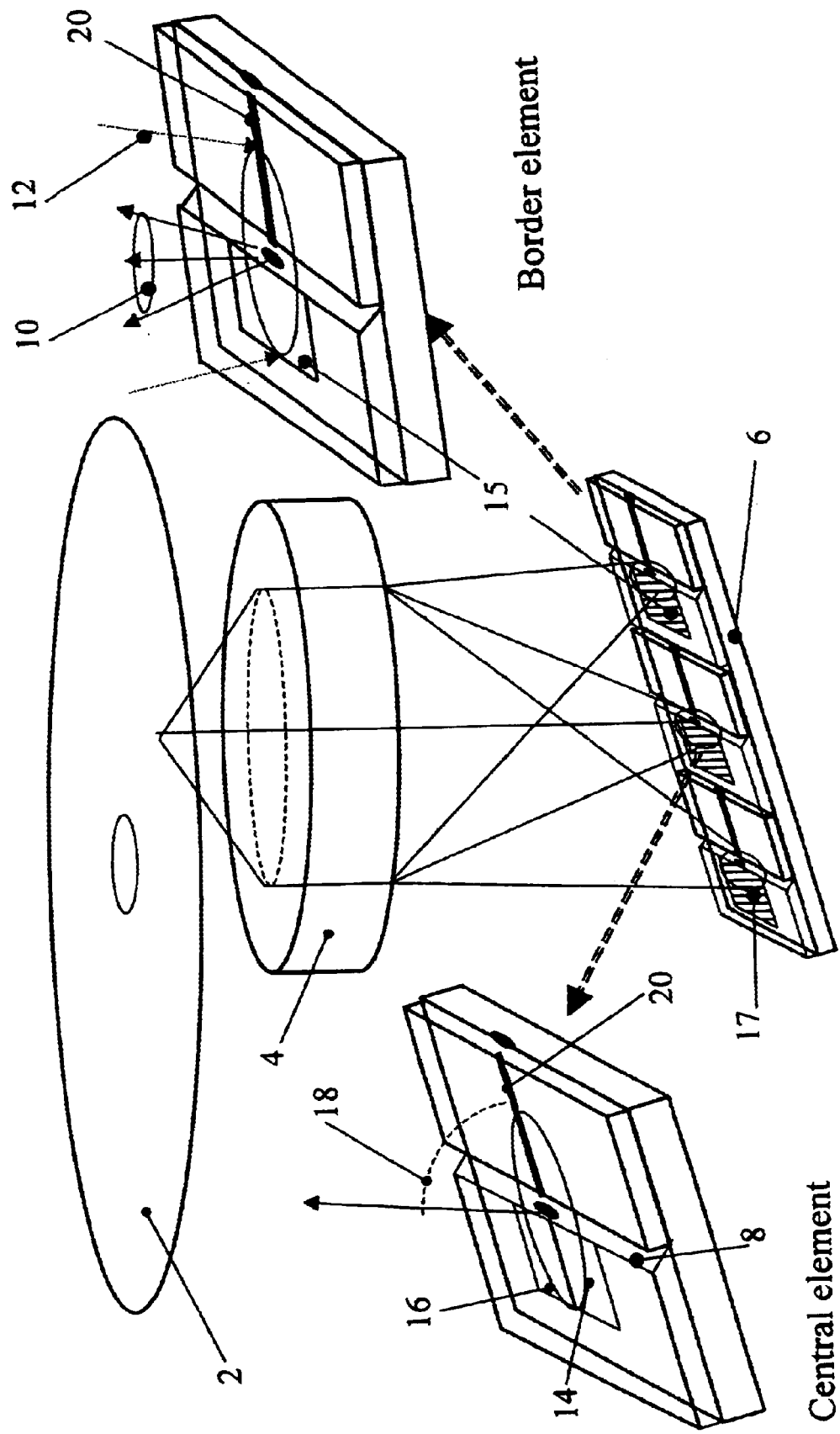
FIG. 1 (prior art) is a schematic representation of a monolithic optical pick-up system using an edge-emitting laser.

FIG. 1 depicts a prior art optical device that is disclosed in U.S. Pat. No. 5,883,913 by Doi et al. and in Optical Data Storage, Technical Digest, 1998, vol. 8 p. 50 by Narui et al. The system contains an integrated single chip 6, lens 4, and optical disk 2. The chip 6 consists of 3 elements, where the central one serves for data reading and tracking purposes, while border ones are needed for detection of focusing error. Each element contains an edge-emitting laser 20. Border elements include a single detector 15, while a central element contains two detectors 14 and 16. The laser beam reflects from the facet 8 that serves as a built-in micro-mirror. As one can see in the insert related to the border element, the returned beam 12 has a much larger diameter on the detector plane than the emitted beam 10. The return beam is spread by diffraction to a spot size with a diameter of 12 $\mu$m at the photodiode surface when the numerical aperture is 0.076 and laser wavelength is 0.78 $\mu$m. The laser beam diameter in the close zone is in the range of about a few microns.

The laser diode was grown on a (100)-oriented n-type GaAs substrate using reactive ion etching. Nondoped GaAs and p-type GaAs layers were selectively grown forming a crystal (111) B facet as a built-in micro-mirror 8. The angle between (100) and (111) faces is 55 degrees, so the laser beam is emitted at angle 18 to substrate equal to 70 degrees. The focus error signal is obtained by comparing the spot size at the photodiodes 15 and 17. The tracking error signal is obtained by the difference in the photo response of the separate diodes 14 and 16 at the center of the chip using a push-pull method.

Figure 4A:
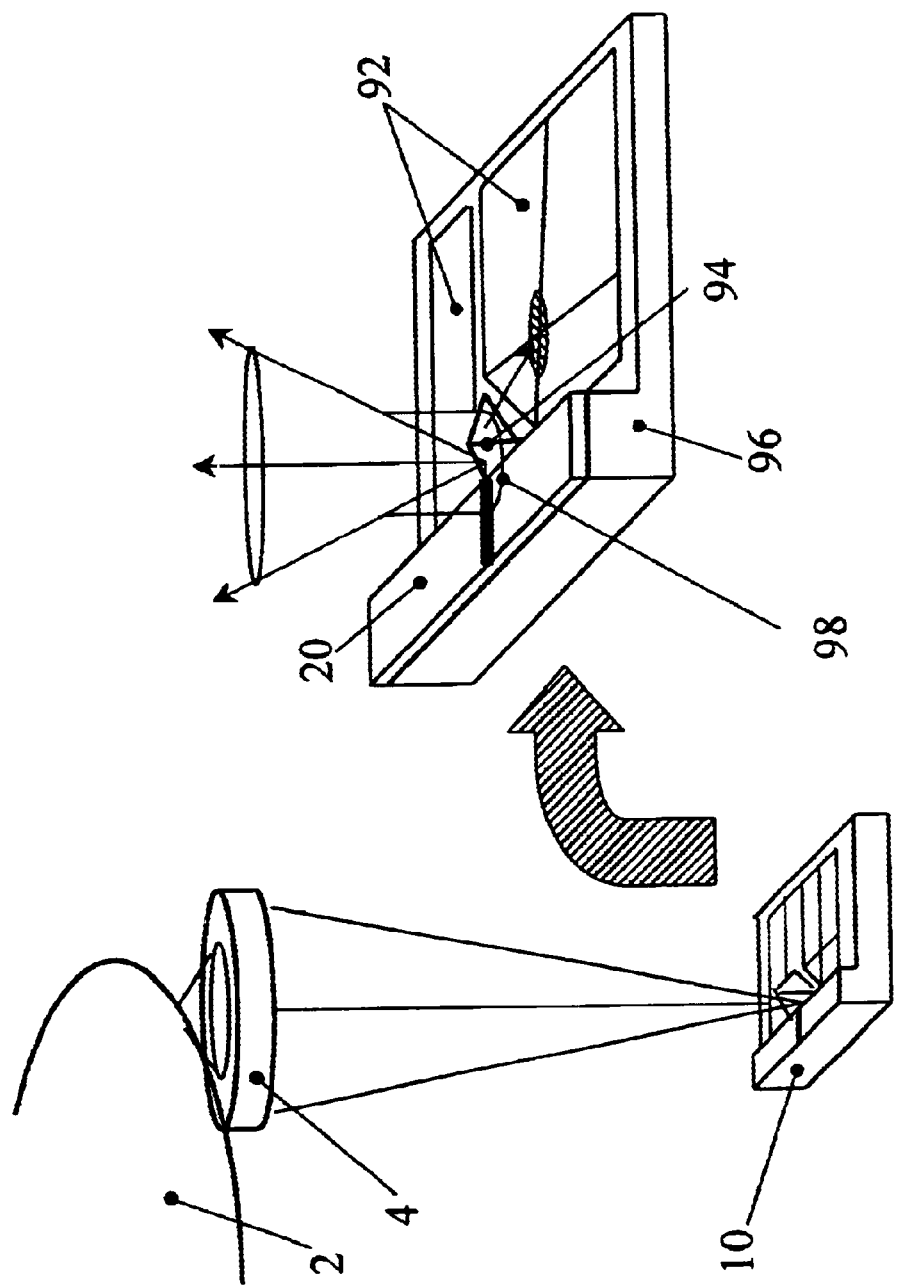
FIG. 4A is a perspective view of another known pickup system with a monolithic chip containing an edge-emitting laser, a reflective pyramid and a photo detector.
Figure 4B:
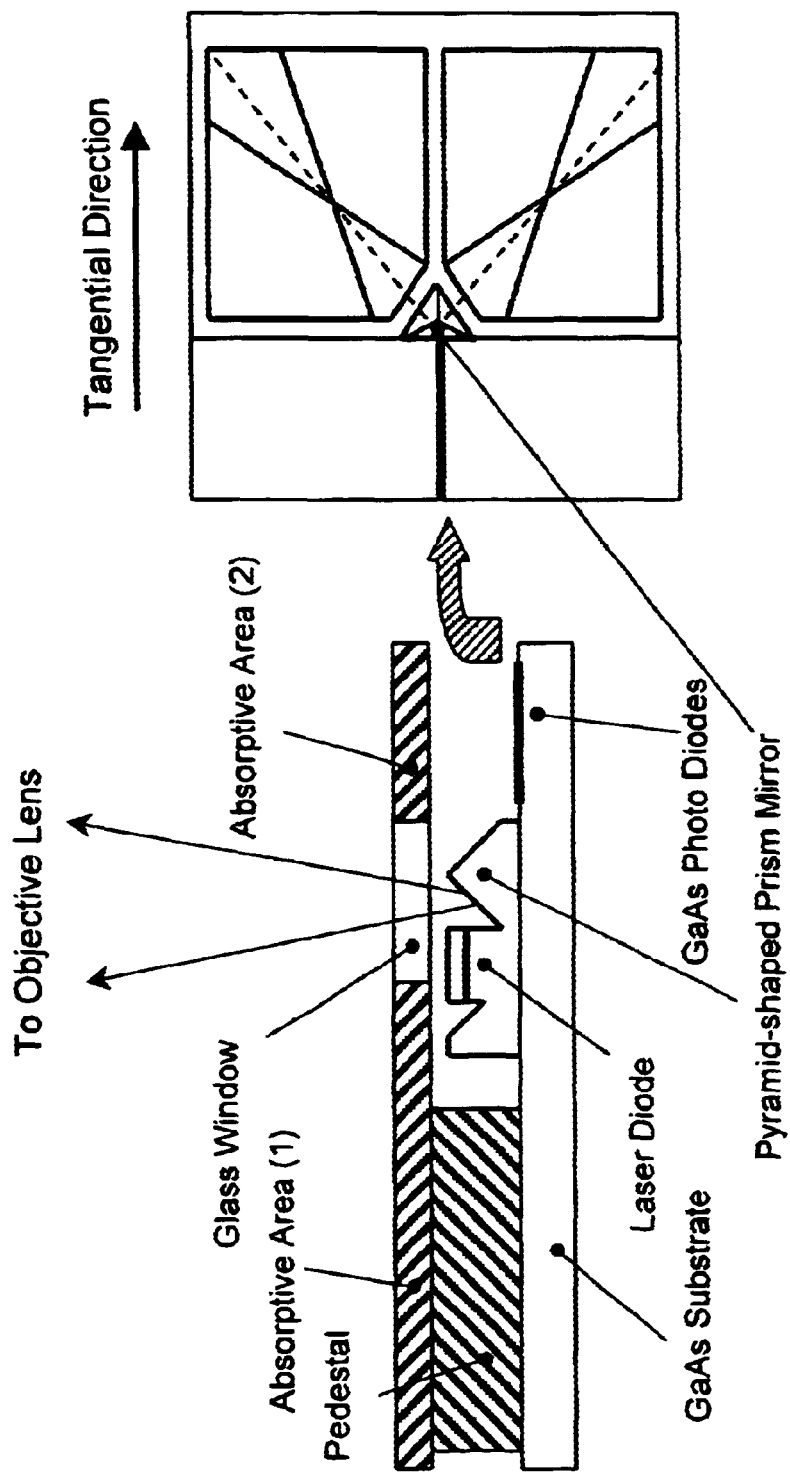
FIG. 4B is a schematic, cross-sectioned view of the device presented in FIG. 4A.

FIGS. 4A and 4B are schematic representations of another monolithic design of Sony's optical pickup disclosed by Mizuno et al. in Japan Journal of Applied Physics, 1999, vol. 38, p. 2002. The light beam emitted from the strip laser diode 20 is reflected by the built-in mirror, which is one of the three reflective surfaces of pyramid 94, and is focused through the objective lens on the disc. The return beam 98 is spread by diffraction on the complete pyramid 94, and its half is deflected back to the laser side, while another half is split by the other two reflective surfaces of the pyramid into 2 fractions. After reflection, these fractions are irradiated on the two quadrant photodiodes 92 on the GaAs substrate. It was reported that covering such structure by glass with a small window improves the sensitivity of the system to tracking and focusing errors. Tracking error is determined with a push-pull method, and focusing error is measured with a knife-edge or Foucault method. The pyramid is made by dry etching, and photo detectors are formed in the third stage of selective epitaxial growth.

The disadvantages of the prior art devices are connected with the use of edge-emitting lasers in their monolithic blocks, combining light sources, detectors and optical reflective elements. The shapes of all monoliths are complicated because of the necessity of laser beam reflection to direct it to a disk. This increases the number of stages in the epitaxial growth and etching. The large size of such lasers compared to the diameter of a reflected beam allows the device to detect less than half of the reflected light. The elliptical shape of an edge-emitting laser beam requires additional corrective optical elements in the design apart from the only lens shown.

Furthermore, since the cavity mirror of an edge-emitting laser is formed by reactive ion etching, there is no reflective coating on the surface, and the laser efficiency is poor. In the present layout, it is also difficult to place a detector on the other end of the edge-emitting laser for monitoring laser power.

In accordance with the present invention, Vertical Cavity Surface Emitting Lasers (VCSELs) are used in monolithic optical pick-up heads to improve their characteristics and to reduce the cost of their production. Of course, it is possible that other means for emitting optical beams, which may or may not exist at the writing of this disclosure, could be used within the scope of the present invention.

Figure 2A:
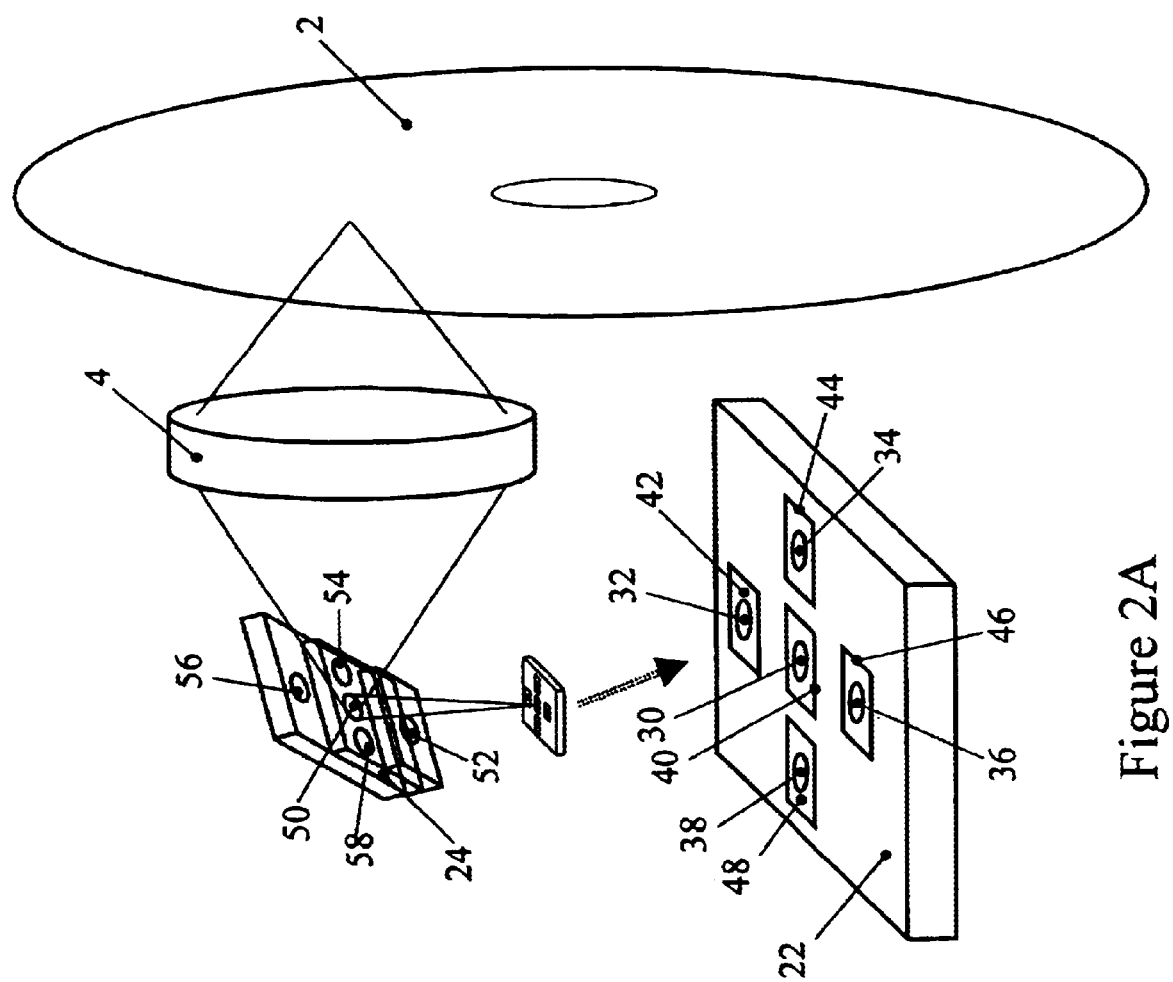
FIG. 2A is a schematic perspective view of an optical pickup and servo control system according to the present invention.

FIG. 2A illustrates an embodiment of such a VCSEL-based monolithic optical pickup system. Five VCSELs 30, 32, 34, 36, 38 emit laser beams, which are reflected by stepped mirror 24 in the positions 50, 52, 54, 56, 58 correspondingly. A lens 4 focuses all beams on the disc 2. The reflected beams from CD 2 pass through the lens, reflect at the stepped mirror 24 again, and are received by the detectors 40, 42, 44, 46, 48, which surround the lasers 30, 32, 34, 36, 38. All VCSELs 30, 32, 34, 36, 38 and photo diodes are integrated into the single chip 22. The returning beam is spread by diffraction to a spot size with a diameter of about 12 microns at the photo-detector surface, while the area occupied by the VCSEL beam is a few microns. Therefore, almost all reflected light is detected.

Figure 2B:
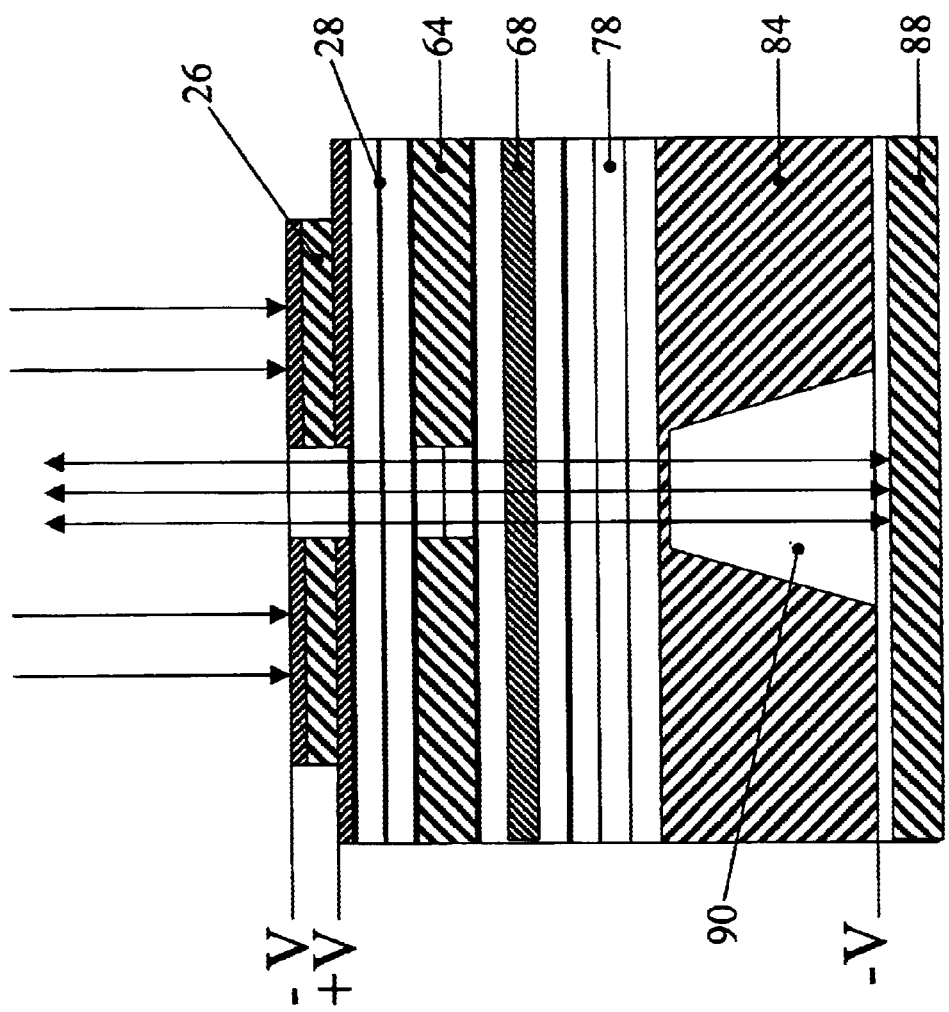
FIG. 2B is a diagrammatic view of a monolithic VCSEL/Photodiode chip with monitoring of VCSEL power according to the present invention.

FIG. 2B shows the structure of a fragment of a chip 22. It is grown on a substrate 84, which is etched from the bottom to make a cavity 90 for monitoring VCSEL power. On the substrate 84, several layers are grown through Molecular Beam Epitaxy (MBE) or Metal Organic Chemical Vapor Deposition (MOCVD) processes along with lithography.

In a VCSEL area, the following layers form sequentially: the bottom Distributed Bragg Reflector (DBR) 78, the multiple quantum well active region 68, and the top DBR 28. The optical aperture 64 of the VCSEL is made with either oxidation or ion implantation processes. All named layers together form a VCSEL. The diameter of the aperture 64 can be made as small as 3 microns.

Photo diode 26 is formed on the top of the VCSEL. The Metal-Semiconductor-Metal (MSM) detector is preferred. In this case, the top VCSEL electrode will serve as a bottom electrode for the detector. The positive voltage will be supplied on a bottom metal layer of the MSM. The negative voltage will be supplied to the top of the MSM diode and to the substrate of the VCSEL. After the photo diode 26 is constructed, the central hole is etched in it up to the VCSEL structure. The diameter of the hole should be close to the VCSEL clear aperture. An additional photo diode 88 is placed below each integrated VCSEL/Detector structure for monitoring the power of the VCSEL.

Figure 2C:
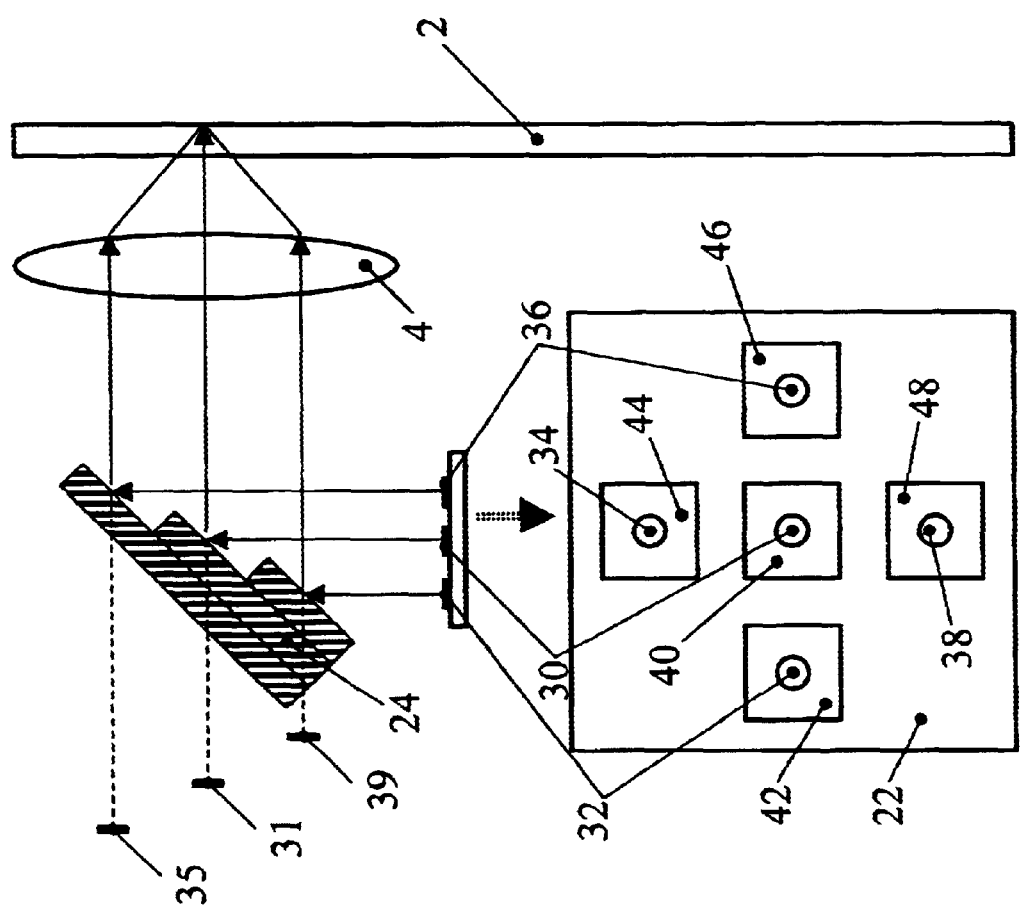
FIG. 2C is a schematic view depicting the role of a stepped mirror under the present invention.

FIG. 2C depicts the role of a stepped mirror 24 in the optical schematic according to the present invention. It is seen that the beams from lasers 32, 30, 36 after reflection from different steps of a mirror 24 have origins 39, 31, 35 correspondingly, which are differently distanced from the lens 4. The beams from the perpendicular line of VCSELs 34 and 38 are reflected from the same step of the mirror 24 as the central beam. Therefore, they do not experience optical paths differences. Lasers 34 and 38 are used for tracking error detection with a 3-beam method. To practice this method, focal spots from lasers 34 and 38 on the disk should be slightly shifted in opposite directions away from the track assigned to the central VCSEL 30. Under this arrangement, the differential signal from detectors 44 and 48, which are associated with lasers 34 and 38, serves as a TES.

Figure 2D:
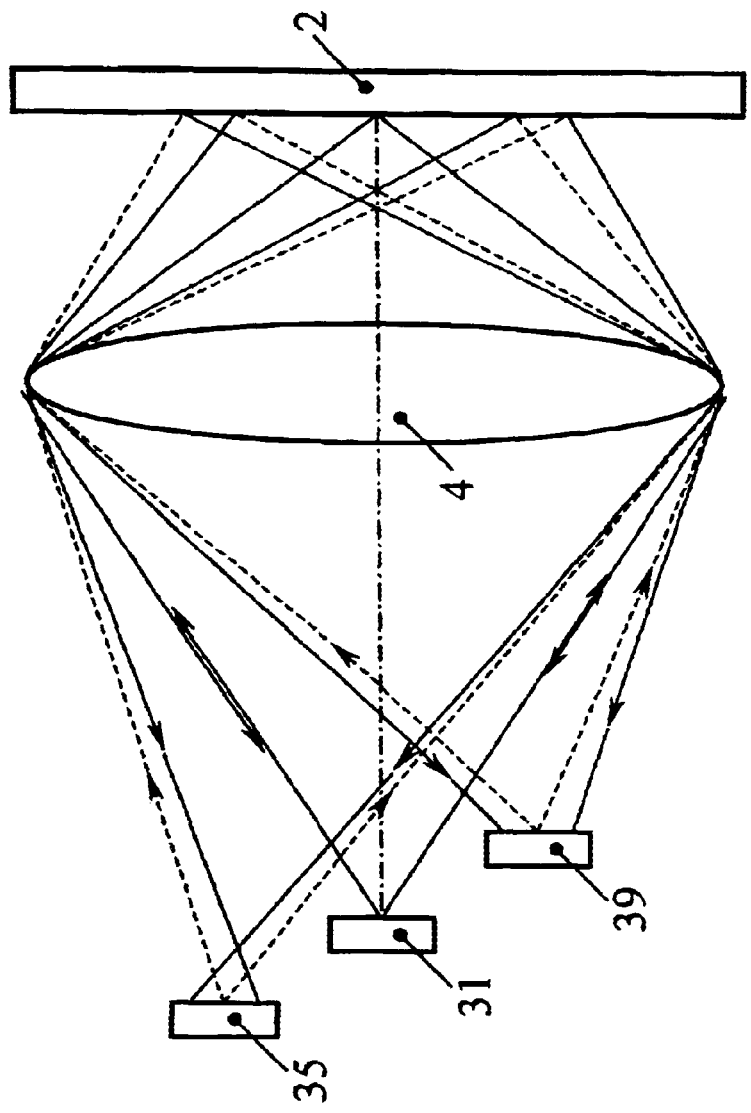
FIG. 2D is a diagram showing an equivalent optical scheme of the present device.

FIG. 2D demonstrates the principle of detecting focus error signal under our design. After reflection from stepped mirror 24, the effective light sources 39, 31, 35 for the beams from lasers 32, 30, 36 are shifted along the optical axis as related to each other. As a result, these beams 39, 31, 35 are focused by lens 4 at the different distances from the disk 2. With this, returned beams are focused at different distances from the detector planes. Therefore, the spot sizes from these beams on the detector planes are different as well. One can see in FIG. 2D that the spots are equal on the border detectors when the central beam is properly focused on the disk.

Figure 2F:
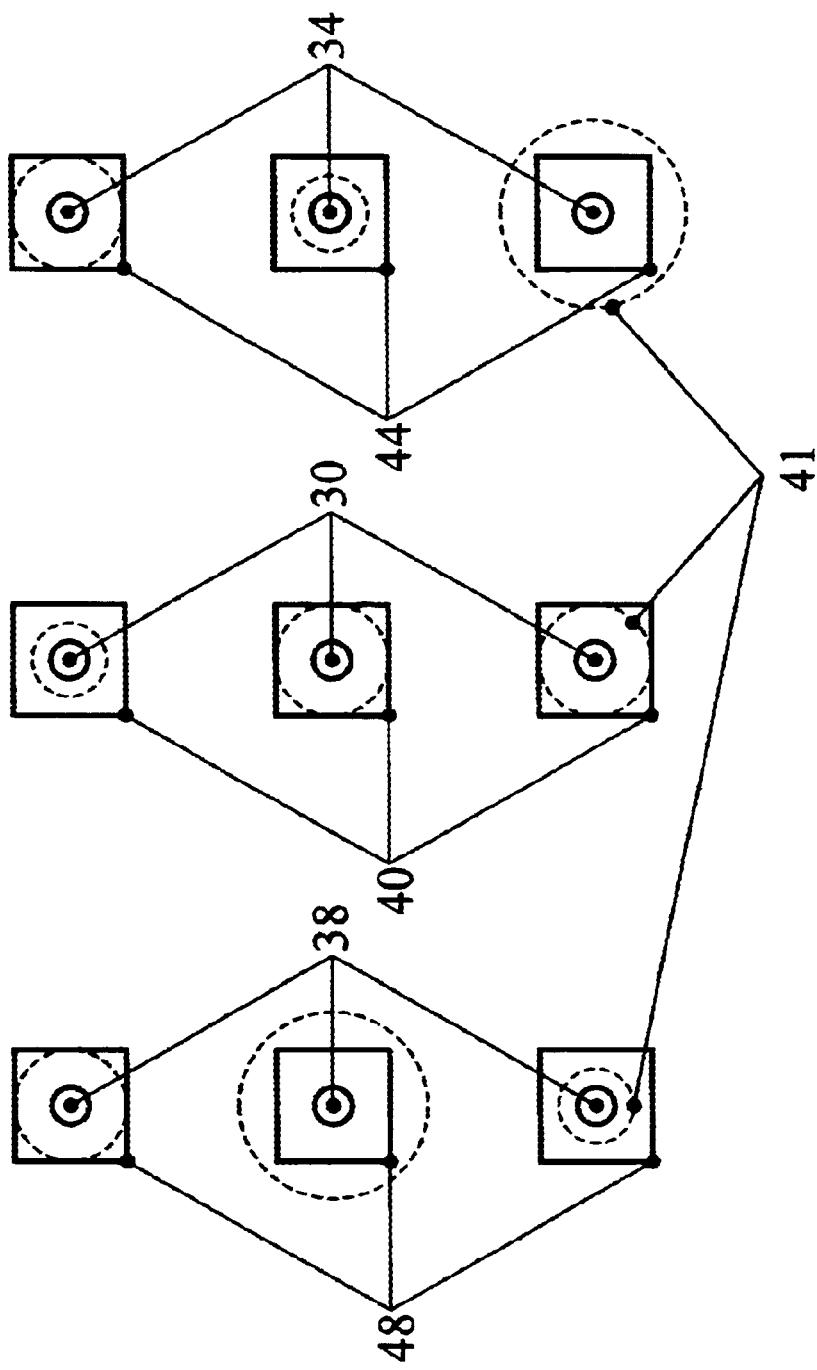
FIG. 2F is an illustrative diagram of a focusing servo process carried out by an optical device according to the present invention.

FIG. 2F demonstrates the spot size method of focus error detection in our design. The relation between sizes of the spots 41 depends on the focus conditions. Therefore, the difference between responses of detectors 48 and 44 can serve as a focusing error signal.

Advantageously, the dimensions of the stepped mirror 24 are small. The size of each reflective plane of the mirror 24 is about the distance between neighboring elements of the chip 22 whereby this parameter belongs in the range of about a few tens of microns. The step size between reflective planes should be equal to some microns. The stepped mirror 24 can be made from semiconductor material through the etching process with the following metal coating.

Figure 3:
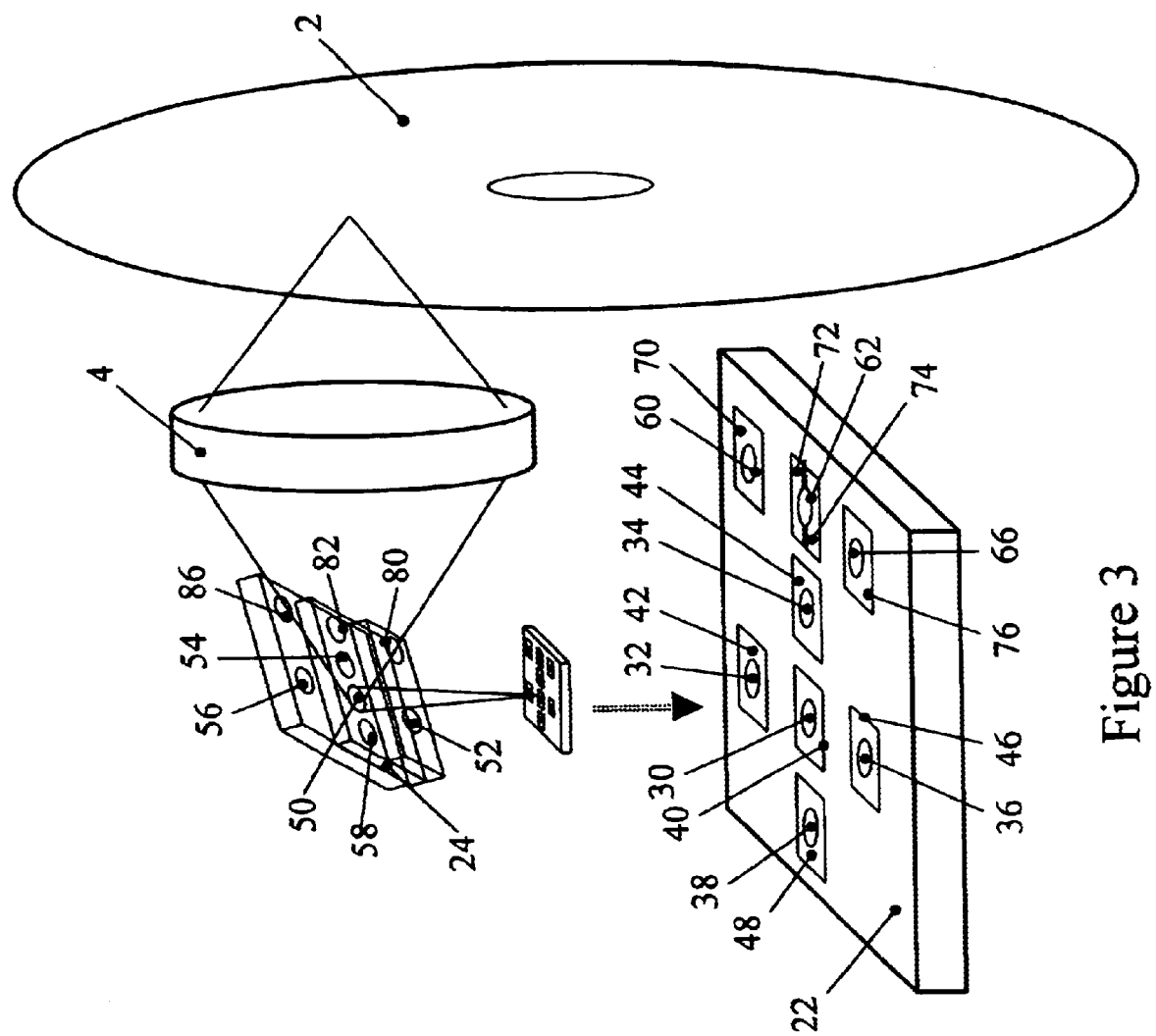
FIG. 3 is a schematic perspective view of a CD/DVD monolithic pickup system with a stepped mirror according to the present invention.

FIG. 3 depicts the combined CD/DVD optical head in accordance with the present invention. To provide such an opportunity, additional VCSELs 60, 62, and 66 with a wavelength of 650 nm are disposed at the extreme right side of the chip 22. They are accompanied with detectors 70, 72, 74, and 76. In the same manner as was described above, diodes 70 and 76 are used for focusing correction when VCSEL 62 is activated. The tracking error detection is performed under a push-pull method that is provided by the difference between signals of the diodes 72 and 74. These two detectors 72 and 74 surround VCSEL 62 and this surrounding area is split by the line corresponding to the track direction. When the system is used for reading from a CD, the same pattern of elements as shown in FIG. 2A is activated.

Figure 5A:
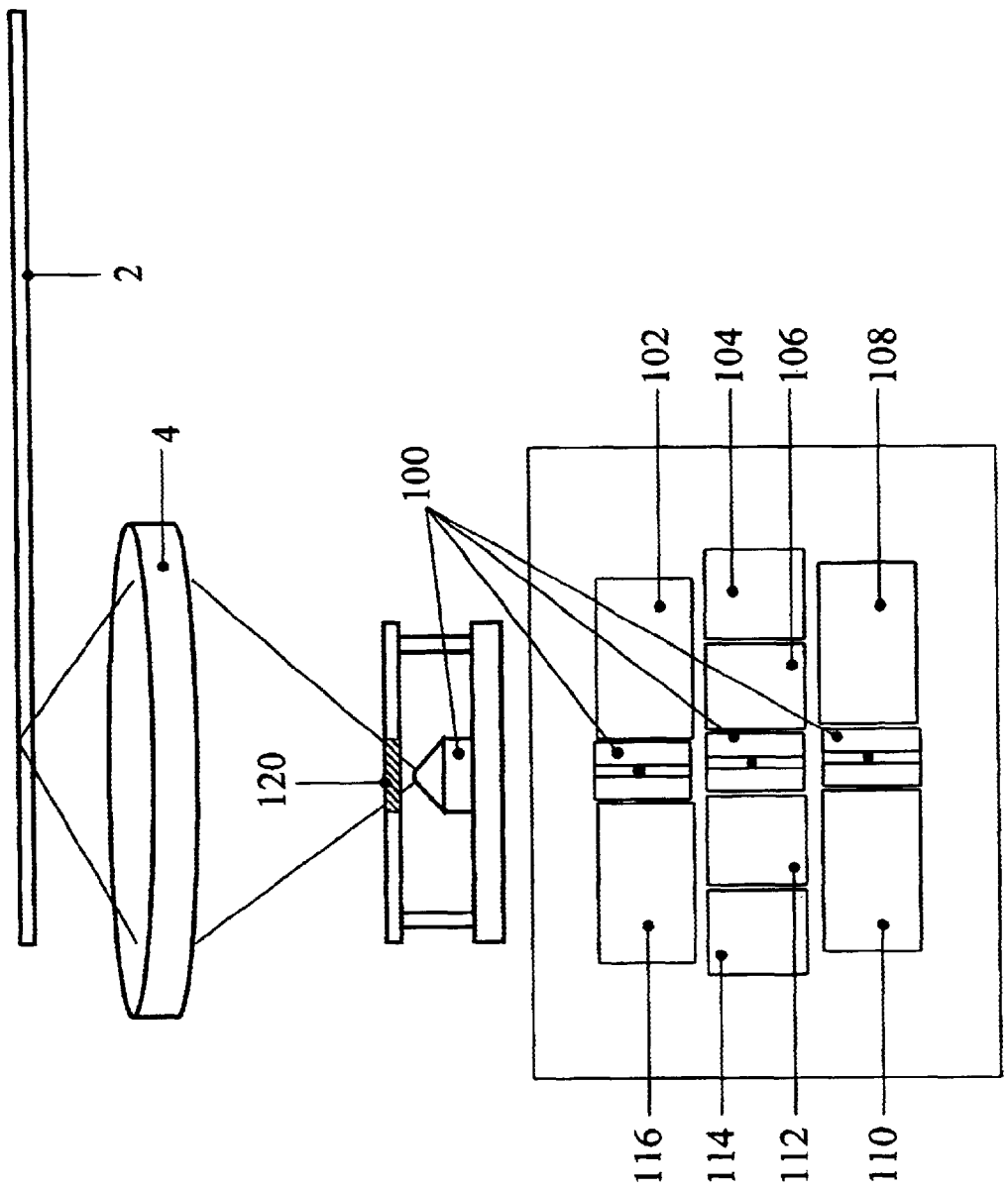
FIG. 5A is a diagrammatic view of an alternative embodiment of the pickup system according to the present invention.

FIG. 5A is a schematic representation of another preferred embodiment of an optical pickup system according to the present invention. A single lens 4 is required to read the data from a disk 2 among optical elements. In addition, reflective surfaces are integrated into the chip containing the VCSELs and photodiodes.

Figure 5B:
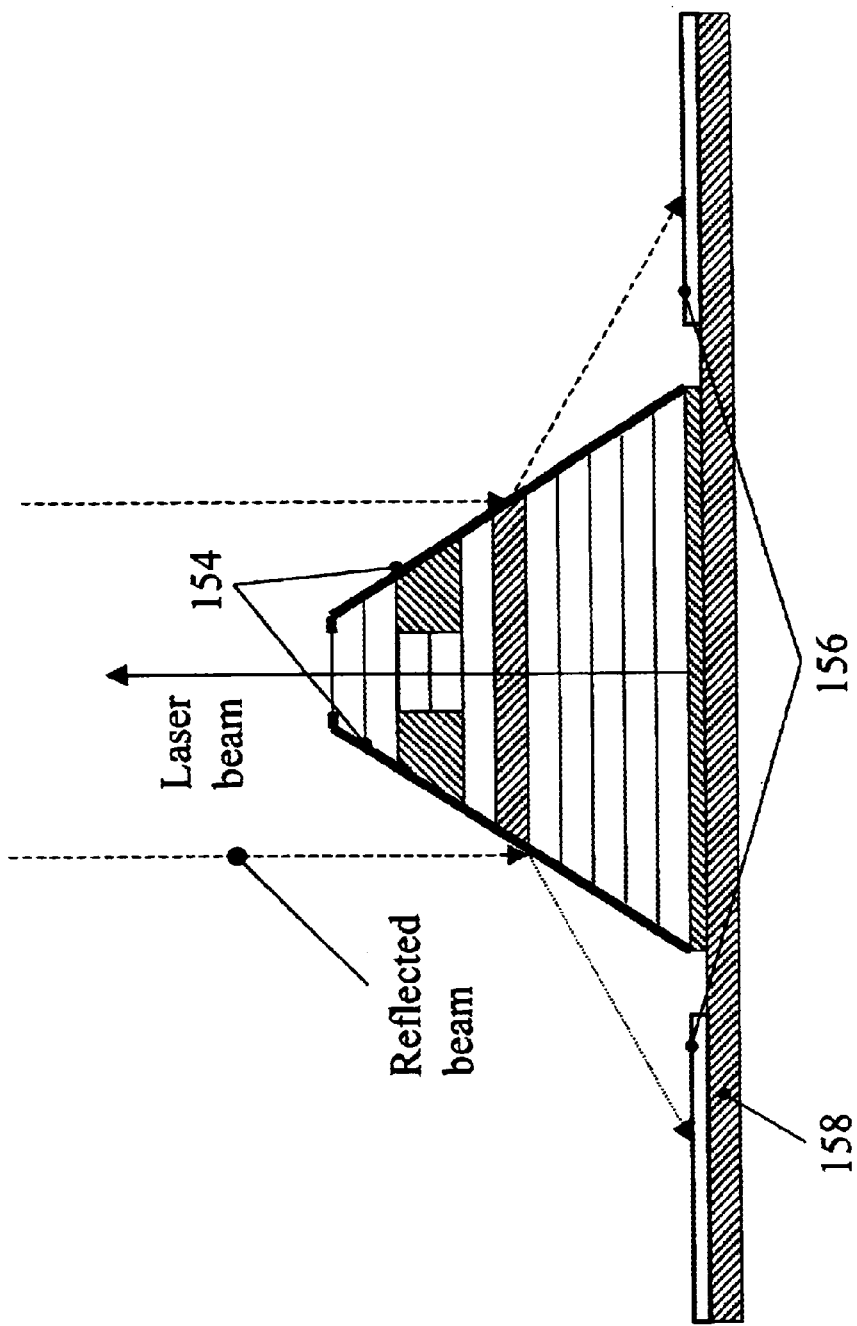
FIG. 5B is a cross-sectioned view of a monolithic chip used in alternative embodiment of the present invention.

Functionally, the integrated chip consists of 3 elements 100 shown in detail in the FIG. 5B. Each element contains a VCSEL for generating a laser beam. The structure of the VCSEL is limited by two planes 154, which serve as micro-mirrors after coating. The layers of the VCSEL are grown on a substrate plane oriented along (100) crystal face. They are grown selectively to form crystalline facets (111) and (−1,−1,1), which are designated as 154 in the FIG. 5B. In this way, the VCSEL structure forms a prism with reflective faces (111) and (−1,−1,1) and cleavage planes described as (−1,1,0). Detectors 156 are grown on the same substrate 158 as a VCSEL. The reflective planes are tilted to horizontal planes at 55 degrees. Therefore, the returned light is deflected by approximately 70 degrees and is directed to detectors 156. Because the size of a top side of a prism is close to the VCSEL aperture, which is about 3 microns, while the diameter of returned beam is more than 10 microns, only the small part of returned light is not detected.

Returning again to FIG. 5A, the top view of all elements is shown. The border elements serve for the tracking purpose, and the tracking error signal (TES) is determined as:

$$TES=(D116+D102)-(D110+D108)$$

The signals from the diodes surrounding the central VCSEL are used to construct a Data Signal (DS):

$$DS=(D112+D114)+D106+D104).$$

The focus error signal (FES) is made using the Foucault method because each half aperture of the returned beam is detected by separated photo diodes:

$$FES=(D114-D112)+(D104-D106).$$

The glass with a transparent small window 120 covers the chip to improve the signal-to-noise ratio during detection of error signals.

Figure 6:
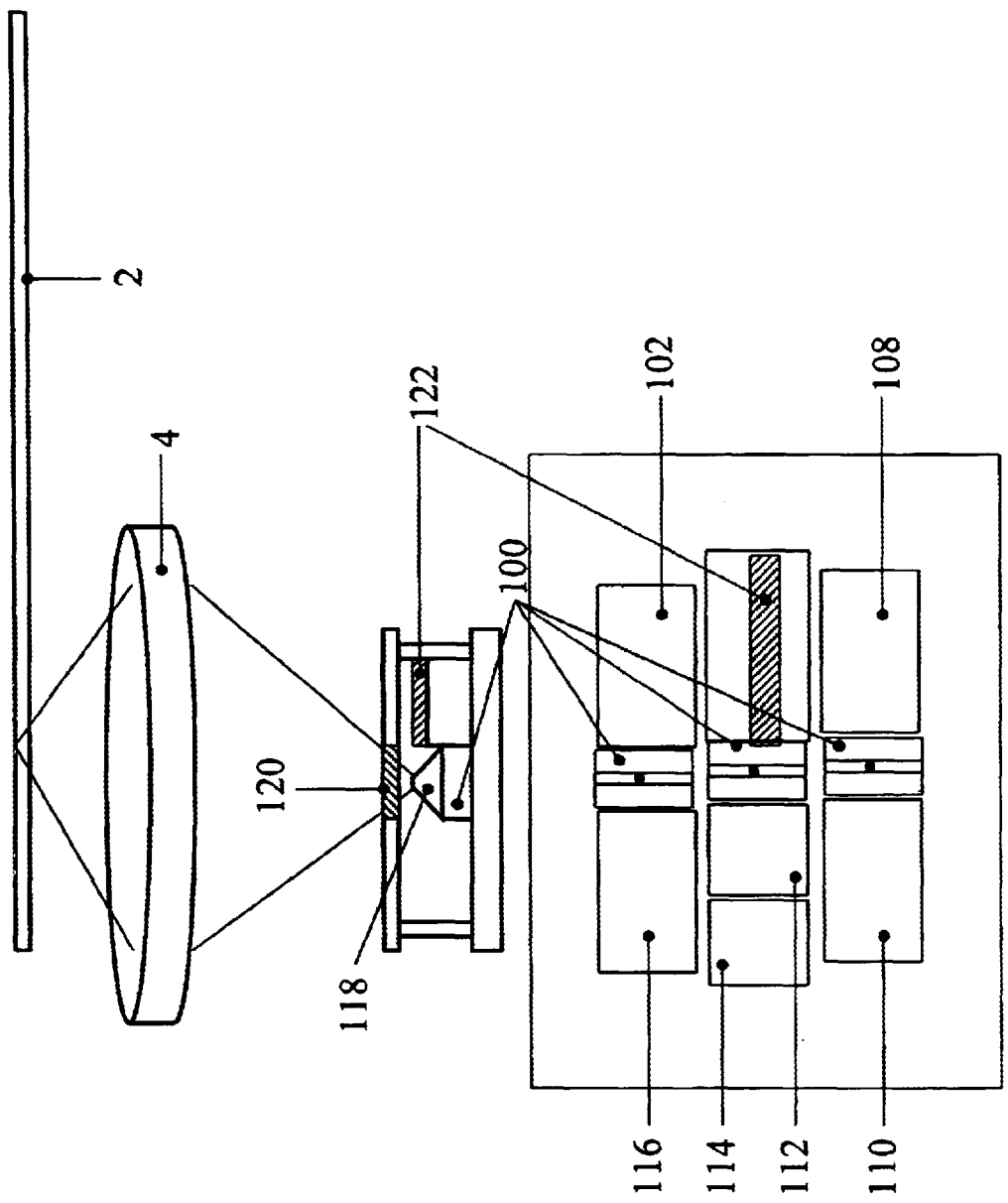
FIG. 6 is a diagrammatic representation of another embodiment of the present invention that is capable of recording and reading optical data.

FIG. 6 is a diagrammatic view of still another embodiment of the invention that provides the opportunity of recording data on the disk surface. For this purpose, a powerful edge-emitting laser 122 is inserted into the chip design. The light from this laser is reflected by the face of prism 100 and is focused by lens 4 on the disk 2 during the recording procedure. The reflected light, with the help of diodes 114 and 112, is used for the focusing correction. The border VCSELs along with accompanying diodes 116, 102, 110, 108 are used for the tracking correction. When reading data, the central VCSEL on the chip is activated instead of edge-emitting laser 122.

FIG. 7A depicts a diagram of an integrated chip designed for reading both CDs and DVDs. One can see two lines of VCSELs 100 and 140 wherein the direction of each line is approximately along the tracks on the disk. These triads are switched when the registered medium is changed from CD to DVD and back. The line on the right side of the figure contains VCSELs with a wavelength of 650 nm, which are appropriate for a DVD, while the line on the left side of the figure contains VCSELs with a longer wavelength of 780 nm for CD reading. The central diodes 142, 102, 152, 108 work with any kind of disk. The border detectors are activated simultaneously with neighboring VCSELs. The data and servo signals are constructed from the diode responses with the same way as for the design shown in FIG. 5A. The chip is covered by glass with small windows above the position of each VCSEL to prevent detector from registration of background light.

Figure 7B:
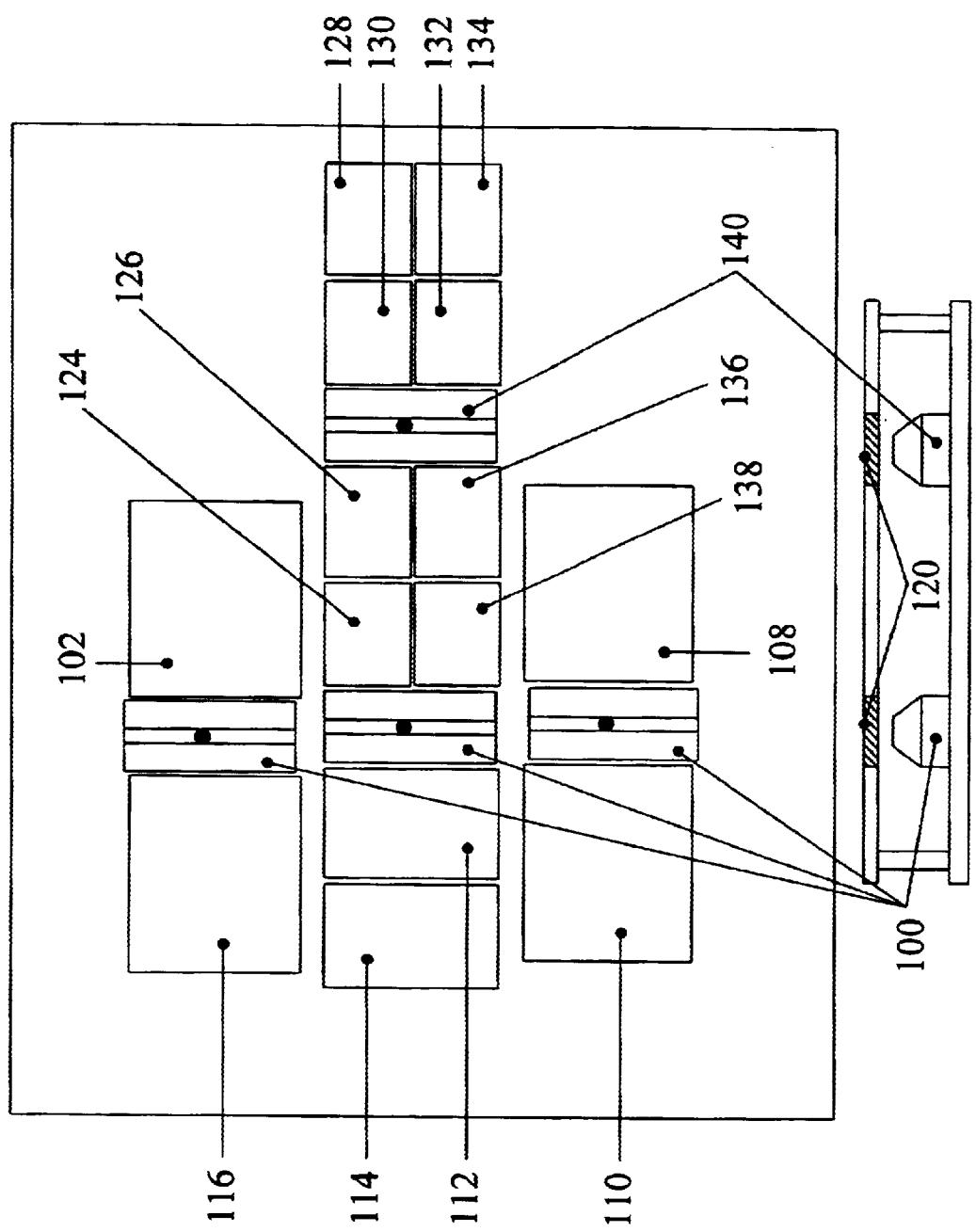
FIG. 7B is a schematic view of still another chip design for an pickup system according to the present invention that is capable of reading optical data from either a CD or a DVD.

FIG. 7B is another arrangement of the embodiment shown in FIG. 7A. The difference between these two designs is caused by another method of tracking error detection than that used in FIG. 7B. In the design of FIG. 7B, the widely used phase difference method is applied. As a result, only one short-wavelength VCSEL 140 is used for DVD reading. Therefore, the detectors surrounding this VCSEL are additionally split. The tracking error during operation with CD is calculated as well as for the design shown in FIG. 5A. Focusing and tracking errors in other cases are calculated according to the following equations:

$$DS_{CD}=(D114+D112)+(D124+D126+D136+D138)$$

$$DS_{DVD}=(D124+D126+D136+D138)+(D128+D130+D132+D134)$$

$$FES_{CD}=(D114-D112)+(D126+D136-D124-D138)$$

$$FES_{DVD}=(D128+D134-d130-d132)-(D126+D136-D124-D138)$$

$$TES_{DVD}=Ph(D124+D136)-Ph(D126+D138)+Ph(D128+D132) \\ Ph(D130+D134)$$

where Ph means the phase of the signal.

From the foregoing, it will be clear that the present invention has been shown and described with reference to certain preferred embodiments that merely exemplify the broader invention revealed herein. Certainly those skilled in the art can conceive of alternative embodiments. For instance, those with the major features of the invention in mind could craft embodiments that incorporate those major features while not incorporating all of the features included in the preferred embodiments.

With the foregoing in mind, the following claims are intended to define the scope of protection to be afforded the inventors, and the claims shall be deemed to include equivalent constructions insofar as they do not depart from the spirit and scope of the present invention. A plurality of the following claims express certain elements as a means for performing a specific function, at times without the recital of structure or material. As the law demands, these claims shall be construed to cover not only the corresponding structure and material expressly described in this specification but also equivalents thereof that may now exist or be developed hereafter.

We claim as deserving the protection of United States Letters Patent:

1. A Monolithic Optical Pickup and Servo Control Device comprising:
    a retaining member;
    a plurality of means for generating an optical beam disposed on the retaining member;
    a plurality of means for detecting a reflected data stream disposed on the retaining member; and
    at least first and second stepped micro-mirror surfaces operably associated with the plurality of means for generating an optical beam and the plurality of means for detecting a reflected data stream for directing the optical beam and the reflected data stream between the plurality of means for generating an optical beam and the plurality of means for detecting a reflected data stream and an optical medium.

2. The monolithic optical pickup system of claim 1 wherein the plurality of means for generating an optical beam and the first and second stepped micro-mirror surfaces are disposed with at least one means for generating an optical beam oriented to emit a beam directed at the first mirrored surface and at least one means for generating an optical beam oriented to emit a beam directed at the second mirrored surface.

3. The monolithic optical pickup system of claim 2 wherein first, second, and third means for generating an optical beam are oriented to emit beams directed at the second mirror surface whereby beams emitted by the first, second, and third means for generating an optical beam follow optical paths that are substantially equal in length and whereby two of the first, second, and third means for generating an optical can provide a tracking error signal and thereby can be employed for tracking error detection relative to the optical recording media.

4. The monolithic optical pickup system of claim 3 further comprising:
    a fourth means for generating an optical beam disposed on the retaining member that is oriented to emit beams directed at the first mirror surface;
    a third mirror surface that is stepped relative to the first and second mirror surfaces; and
    a fifth means for generating an optical beam disposed on the retaining member that is oriented to emit laser beams directed at the third mirror surface;
    whereby laser beams emitted by the fourth and fifth means for generating an optical beam follow optical paths that are different in length than one another and whereby beams emitted by the first, second, and third means for generating an optical beam follow optical paths that are different in length than the lengths of the optical paths followed by beams emitted by the fourth and fifth means for generating an optical beam;

whereby spot sizes of beams reflected onto the means for detecting a reflected data stream paired with the first, second, third, fourth, and fifth means for generating an optical beam can be used to provide a focus error signal and thereby can be employed for focus error detection relative to the optical recording media.

5. The Monolithic Optical Pickup and Servo Control Device of claim 1 further comprising a means for recording data on an optical medium.

6. The Monolithic Optical Pickup and Servo Control Device of claim 5 wherein the means for recording data comprises an edge-emitting laser.

7. The Monolithic Optical Pickup and Servo Control Device of claim 1 wherein the plurality of means for generating an optical beam comprises a plurality of VCSELs.

8. The Monolithic Optical Pickup and Servo Control Device of claim 1 wherein the plurality of means for generating an optical beam comprises a first plurality of means for generating an optical beam that generate optical beams of a first wavelength for interacting with a DVD and a second plurality of means for generating an optical beam that generate optical beams of a second wavelength for interacting with a CD.

9. A VCSEL-based monolithic optical pickup system for use with optical recording media, the optical pickup system comprising:

a retaining member;

a plurality of VCSELs disposed on the retaining member for emitting laser beams;

a plurality of detectors disposed on the retaining member for receiving reflected laser beams;

a means for reflecting laser beams emitted by the plurality of VCSELs toward optical recording media;

a means for reflecting laser beams reflected from the recording media toward the plurality of detectors.

10. The VCSEL-based monolithic optical pickup system of claim 9 wherein the plurality of VCSELs and the plurality of detectors are disposed in laser/detector pairs wherein each detector surrounds its respective VCSEL.

11. The VCSEL-based monolithic optical pickup system of claim 10 wherein the plurality of detectors each comprise photo-detectors.

12. The VCSEL-based monolithic optical pickup system of claim 10 wherein the means for reflecting laser beams emitted by the plurality of VCSELs toward the optical recording media and the means for reflecting laser beams reflected from the optical recording media toward the plurality of detectors cooperate to reflect a laser beam reflected from the recording media onto the laser/detector pair of the VCSEL that emitted the respective laser beam.

13. The VCSEL-based monolithic optical pickup system of claim 12 wherein the detector of each laser/detector pair has a surface area that is greater than a surface area of the VCSEL of that laser/detector pair thereby enabling each detector to detect more reflected light than can be reflected onto the VCSEL of that laser/detector pair.

14. The VCSEL-based monolithic optical pickup system of claim 9 further comprising a means for focusing the laser beams emitted by the plurality of VCSELs onto the optical recording media.

15. The VCSEL-based monolithic optical pickup system of claim 9 wherein the means for reflecting laser beams emitted by the plurality of VCSELs toward optical recording media and the means for reflecting laser beams reflected from the optical recording media toward the plurality of detectors comprises at least a first mirror surface and a second mirror surface wherein the first mirror surface is stepped relative to the second mirror surface.

16. The VCSEL-based monolithic optical pickup system of claim 15 wherein the plurality of VCSELs and the first and second mirrored surfaces are disposed with at least one VCSEL oriented to emit a laser beam directed at the first mirrored surface and at least one VCSEL oriented to emit a laser beam directed at the second mirrored surface.

17. The VCSEL-based monolithic optical pickup system of claim 16 wherein first, second, and third VCSELs are oriented to emit laser beams directed at the second mirror surface whereby laser beams emitted by the first, second, and third VCSELs follow optical paths that are substantially equal in length and whereby two of the first, second, and third VCSELs can provide a tracking error signal and thereby can be employed for tracking error detection relative to the optical recording media.

18. The VCSEL-based monolithic optical pickup system of claim 17 further comprising:

a fourth VCSEL disposed on the substrate that is oriented to emit laser beams directed at the first mirror surface;

a third mirror surface that is stepped relative to the first and second mirror surfaces; and a fifth VCSEL disposed on the retaining member that is oriented to emit laser beams directed at the third mirror surface;

whereby laser beams emitted by the fourth and fifth VCSELs follow optical paths that are different in length than one another and whereby laser beams emitted by the first, second, and third VCSELs follow optical paths that are different in length than the lengths of the optical paths followed by laser beams emitted by the fourth and fifth VCSELs;

whereby spot sizes of laser beams reflected onto the detectors paired with the first, second, third, fourth, and fifth VCSELs can be used to provide a focus error signal and thereby can be employed for focus error detection relative to the optical recording media.

19. The VCSEL-based monolithic optical pickup system of claim 18 wherein the first, second, and third mirror surfaces are fixed together.

20. The VCSEL-based monolithic optical pickup system of claim 19 wherein the first, second, and third mirror surfaces are formed on a unitary piece of material.

21. The VCSEL-based monolithic optical pickup system of claim 20 wherein the first, second, and third mirror surfaces are formed on the unitary piece of material by a coating of reflective material.

22. The VCSEL-based monolithic optical pickup system of claim 18 further comprising:

a sixth VCSEL disposed on the retaining member that is oriented to emit laser beams directed at the second mirror surface;

two detectors aligned on the retaining member to receive laser beams that have been emitted by the sixth VCSEL and reflected back from the optical recording media;

a seventh VCSEL disposed on the retaining member that is oriented to emit laser beams directed at the first mirror surface;

a detector aligned on the retaining member to receive laser beams that have been emitted by the seventh VCSEL and reflected back from the optical recording media;

an eighth VCSEL disposed on the retaining member that is oriented to emit laser beams directed at the third mirror surface;

a detector aligned on the retaining member to receive laser beams that have been emitted by the eighth VCSEL and reflected back from optical recording media;

whereby the VCSEL-based monolithic optical pickup system can be used as a CD/DVD optical head wherein the detectors aligned to receive laser beams emitted by the seventh and eighth VCSELs can be used for focusing correction and wherein the two detectors aligned to receive laser beans emitted by the sixth VCSEL can be used for tracking error detection under a push-pull method.

23. A VCSEL-based monolithic optical pickup system for use with optical recording media, the optical pickup system comprising:

a retaining member with a first surface and a second surface;

an upstanding first VCSEL that projects from the first surface of the retaining member for emitting laser beams;

wherein the first VCSEL has a first side surface disposed opposite to a second side surface, wherein at least a portion of at least the first side surface is mirrored, and wherein at least the first side surface is disposed with an exterior angle between the first side surface of the first VCSEL and the first surface of the retaining member that is obtuse;

a detector disposed on the first surface of the retaining member adjacent to the first side surface of the first VCSEL;

whereby a laser beam emitted by the first VCSEL can be directed to an optical recording media, then reflected from the optical recording media onto the first side surface of the first VCSEL, and then reflected by the first side surface of the first VCSEL onto the detector adjacent to the first side surface of the first VCSEL.

24. The VCSEL-based monolithic optical pickup system of claim 23 wherein the first side surface of the first VCSEL is disposed with an exterior angle of approximately 135 degrees such that the first side surface is sloped at an angle of approximately 55 degrees.

25. The VCSEL-based monolithic optical pickup system of claim 23 wherein the second side surface of the first VCSEL is mirrored and disposed with an exterior angle between the second side surface of the first VCSEL and the first surface of the retaining member that is obtuse and further comprising a detector disposed on the first surface of the retaining member adjacent to the second side surface of the first VCSEL.

26. The VCSEL-based monolithic optical pickup system of claim 25 further comprising:

second and third VCSELs disposed on the first surface of the retaining member each of the second and third VCSELs with a first side surface disposed opposite to a second side surface, wherein the first and second side surfaces are mirrored, and wherein the first and second side surfaces are disposed with an exterior angle between each side surface and the first surface of the retaining member that is obtuse;

a detector disposed on the first surface of the retaining member adjacent to the first side surface of the second VCSEL;

a detector disposed on the first surface of the retaining member adjacent to the second side surface of the second VCSEL;

a detector disposed on the first surface of the retaining member adjacent to the first side surface of the third VCSEL; and a detector disposed on the first surface of the retaining member adjacent to the second side surface of the third VCSEL;

whereby a tracking error signal can be generated by subtracting the result of adding the signals from the detectors disposed adjacent to the first and second sides of the first VCSEL from the result of adding the signals from the detectors disposed adjacent to the third VCSEL.

27. The VCSEL-based monolithic optical pickup system of claim 26 wherein a first detector and a second detector are disposed on the first surface of the retaining member adjacent to the first side surface of the second VCSEL and wherein a first detector and a second detector are disposed on the first surface of the retaining member adjacent to the second side surface of the second VCSEL whereby a data signal can be generated by adding the combined signals from the first and second detectors disposed adjacent to the first side surface of the second VCSEL to the combined signals from the first and second detectors disposed adjacent to the second side surface of the second VCSEL and whereby a focus error signal can be generated by adding the difference between the signals from the first and second detectors disposed adjacent to the first side surface of the second VCSEL to the difference between the signals from the first and second detectors disposed adjacent to the second side surface of the second VCSEL.

28. The VCSEL-based monolithic optical pickup system of claim 26 further comprising fourth, fifth, and sixth VCSELs disposed on the retaining member each of the fourth, fifth, and sixth VCSELs with a first side surface disposed opposite to a second side surface, wherein the first and second side surfaces are mirrored, and wherein the first and second side surfaces are disposed with an exterior angle between each side surface and the first surface of the retaining member that is obtuse.

29. The VCSEL-based monolithic optical pickup system of claim 28 wherein the first, second, and third VCSELs are disposed in a first alignment, wherein the fourth, fifth, and sixth VCSELs are disposed in a second alignment, and wherein each of the first and second alignments are disposed to align with tracks on an optical recording medium.

30. The VCSEL-based monolithic optical pickup system of claim 29 wherein the first, second, and third VCSELs of the first alignment emit laser beams at a first wavelength and wherein the fourth, fifth, and sixth VCSELs of the second alignment emit laser beams of a second wavelength that is different from the first.

31. The VCSEL-based monolithic optical pickup system of claim 30 wherein the first wavelength is approximately 650 nm whereby the first, second, and third VCSELs can be used for DVD reading and wherein the second wavelength is approximately 780 nm whereby the fourth, fifth, and sixth VCSELs can be used for CD reading.

32. The VCSEL-based monolithic optical pickup system of claim 29 wherein the first and second alignments are disposed in a generally parallel relationship with the first and fourth VCSELs adjacently disposed, the second and fifth VCSELs adjacently disposed, and the third and sixth VCSELs adjacently disposed.

33. The VCSEL-based monolithic optical pickup system of claim 32 wherein a detector is disposed between the first and fourth VCSELs to receive laser beams reflected by both of the first and fourth VCSELs, a detector is disposed outboard of each of the first and fourth VCSELs to receive laser beams reflected by the VCSEL adjacent to which the respective detector is disposed, two detectors are disposed between the second and fifth VCSELs to receive laser beams reflected by both of the first and fourth VCSELs, two detectors are disposed outboard of each of the second and fifth VCSELs to receive laser beams reflected by the VCSEL adjacent to which the respective detector is disposed, a detector is disposed between the third and sixth VCSELs to receive laser beams reflected by both of the third and sixth VCSELs, a detector is disposed outboard of each of the third and sixth VCSELs to receive laser beams reflected by the VCSEL adjacent to which the respective detector is disposed.

34. The VCSEL-based monolithic optical pickup system of claim 26 wherein the first, second, and third VCSELs are disposed in a general alignment and further comprising a fourth VCSEL disposed on the retaining member wherein the second and fourth VCSELs are adjacently disposed.

35. The VCSEL-based monolithic optical pickup system of claim 34 wherein the first, second, and third VCSELs emit laser beams at a first wavelength and wherein the fourth VCSEL emits laser beams of a second wavelength that is different from the first.

36. The VCSEL-based monolithic optical pickup system of claim 35 wherein the first wavelength is approximately 780 nm whereby the first, second, and third VCSELs can be used for CD reading and wherein the second wavelength is approximately 650 nm whereby the fourth VCSEL can be used for DVD reading.

37. The VCSEL-based monolithic optical pickup system of claim 34 wherein two detectors are disposed outboard of the first VCSEL, four detectors are disposed between the first and fourth VCSELs, and four detectors are disposed outboard of the fourth VCSEL whereby a phase difference method of tracking error detection can be employed.

38. The VCSEL-based monolithic optical pickup system of claim 23 further comprising a means for focusing the laser beam emitted by the first VCSEL onto the optical recording media.

39. The VCSEL-based monolithic optical pickup system of claim 23 further comprising an edge-emitting laser disposed on the retaining member wherein the edge-emitting laser is aligned to emit a laser beam directed at the first side surface of the first VCSEL whereby the laser beam emitted by the edge-emitting laser will be reflected by the first side surface toward the optical recording media whereby the VCSEL-based monolithic optical pickup system can record data on the optical recording media.

40. A monolithic optical pickup system for use with optical recording media, the optical pickup system comprising:

a retaining member with a first surface and a second surface;

an upstanding first means for generating an optical beam that projects from the first surface of the retaining member for emitting optical beams;

wherein the first means for generating an optical beam has a first side surface disposed opposite to a second side surface, wherein at least a portion of at least the first side surface is mirrored, and wherein at least the first side surface is disposed with an exterior angle between the first side surface of the first means for generating an optical beam and the first surface of the retaining member that is obtuse;

a detector disposed on the first surface of the retaining member adjacent to the first side surface of the first first means for generating an optical beam;

whereby a laser beam emitted by the first means for generating an optical beam can be directed to an optical recording media, then reflected from the optical recording media onto the first side surface of the first means for generating an optical beam, and then reflected by the first side surface of the first means for generating an optical beam onto the detector adjacent to the first side surface of the first means for generating an optical beam.

41. The monolithic optical pickup system of claim 40 wherein the first side surface of the first means for generating an optical beam is disposed with an exterior angle of approximately 135 degrees such that the first side surface is sloped at an angle of approximately 55 degrees.

42. The monolithic optical pickup system of claim 40 wherein the second side surface of the first means for generating an optical beam is mirrored and disposed with an exterior angle between the second side surface of the first means for generating an optical beam and the first surface of the retaining member that is obtuse and further comprising a detector disposed on the first surface of the retaining member adjacent to the second side surface of the first means for generating an optical beam.

\* \* \* \* \*